(12) United States Patent
McGuinness et al.

(10) Patent No.: US 7,719,403 B2
(45) Date of Patent: May 18, 2010

(54) FILM RESISTOR AND A METHOD FOR FORMING AND TRIMMING A FILM RESISTOR

(75) Inventors: Patrick M. McGuinness, Limerick (IE); Bernard P. Stenson, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/554,352

(22) Filed: Sep. 4, 2009

(65) Prior Publication Data

US 2009/0322466 A1 Dec. 31, 2009

Related U.S. Application Data

(62) Division of application No. 11/231,054, filed on Sep. 20, 2005, now Pat. No. 7,598,841.

(51) Int. Cl.
*H01C 10/00* (2006.01)
(52) U.S. Cl. .................. 338/195; 338/308; 338/320; 29/610.1
(58) Field of Classification Search .......... 338/195, 338/307–309, 320; 29/610.1
See application file for complete search history.

(56) References Cited

U.S. PATENT DOCUMENTS

| 3,928,837 | A | 12/1975 | Esper et al. |
| 3,995,249 | A | 11/1976 | Ferry |
| 4,196,411 | A | 4/1980 | Kaufman |
| 4,286,249 | A | 8/1981 | Lewis et al. |
| 4,298,856 | A | 11/1981 | Schuchardt |
| 4,505,032 | A | 3/1985 | Praria |
| 4,682,143 | A | 7/1987 | Chu et al. |

(Continued)

FOREIGN PATENT DOCUMENTS

DE 2054721 11/1970

(Continued)

OTHER PUBLICATIONS

International Search Report and Written Opinion for PCT/IE2006/000100, Dec. 4, 2006.

*Primary Examiner*—Kyung Lee
(74) *Attorney, Agent, or Firm*—Sunstein Kann Murphy & Timbers LLP

(57) ABSTRACT

A thin film resistor (5) of an integrated circuit comprises an elongate resistive film (7) extending between electrical contact pads (10,11). A low impedance element (20) overlays and is electrically coupled to a portion of the resistive film (7) in an intermediate portion (22) thereof adjacent a second side edge (17) of the resistive film (7) for conducting current in parallel with the intermediate portion (22), and for reducing current density in the intermediate portion (22). First and second transverse edges (28,29) formed by spaced apart first and second slots (26,27) which extend from a first side edge (16) into the resistive film (7) define with a first side edge (16) of the resistive film (7) and the low impedance element (20) first and second trimmable areas (30,31) in the intermediate portion (22). Coarse trimming of the thin film resistor (5) is carried out by progressively extending a first trimming slot (34) into the first trimmable area (30) from the first transverse edge (28), and fine trimming is carried out by extending a second trimming slot (35) into the second trimmable area (31) from the second transverse edge (29).

29 Claims, 8 Drawing Sheets

U.S. PATENT DOCUMENTS

| | | |
|---|---|---|
| 4,862,136 A | 8/1989 | Birkner |
| 4,999,731 A | 3/1991 | Bender et al. |
| 5,015,989 A | 5/1991 | Wohlfarth et al. |
| 5,268,651 A | 12/1993 | Kerth |
| 5,309,136 A | 5/1994 | Rezgui et al. |
| 5,601,367 A | 2/1997 | Nara |
| 5,640,137 A | 6/1997 | Mantha |
| 5,872,504 A | 2/1999 | Greitschus et al. |
| 5,929,746 A | 7/1999 | Edwards, Jr. et al. |
| 6,084,502 A | 7/2000 | Ariga et al. |
| 6,304,167 B1 | 10/2001 | Nakayama |
| 6,452,519 B1 | 9/2002 | Swanson |
| 6,489,881 B1 | 12/2002 | Aleksandravicius et al. |
| 6,667,683 B1 | 12/2003 | Emili et al. |
| 7,057,491 B2 | 6/2006 | Dempsey |

FOREIGN PATENT DOCUMENTS

| | | |
|---|---|---|
| EP | 1011110 A1 | 7/1998 |
| EP | 0955678 | 11/1999 |
| EP | 1093132 A2 | 7/2000 |
| JP | 6084621 | 3/1994 |
| JP | 10032110 | 2/1998 |

Prior Art

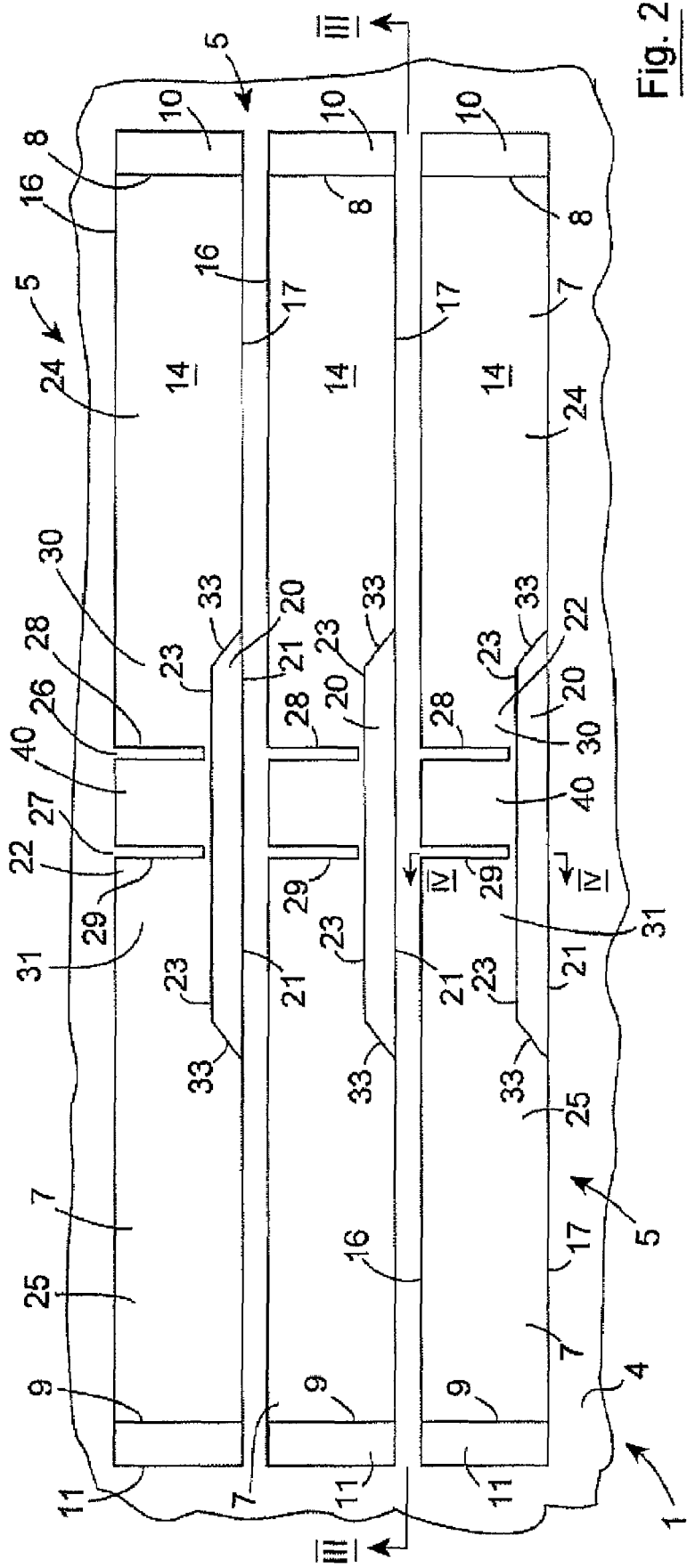
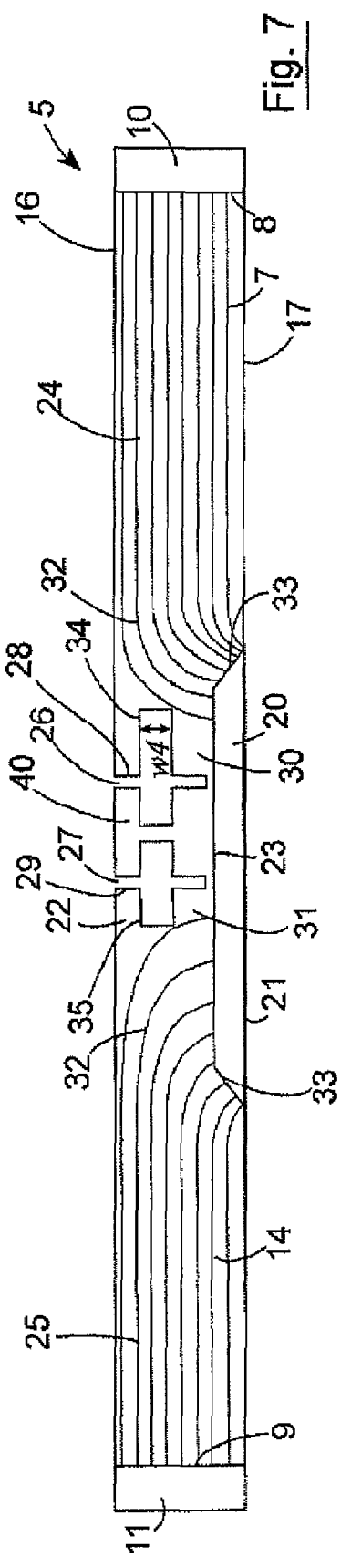

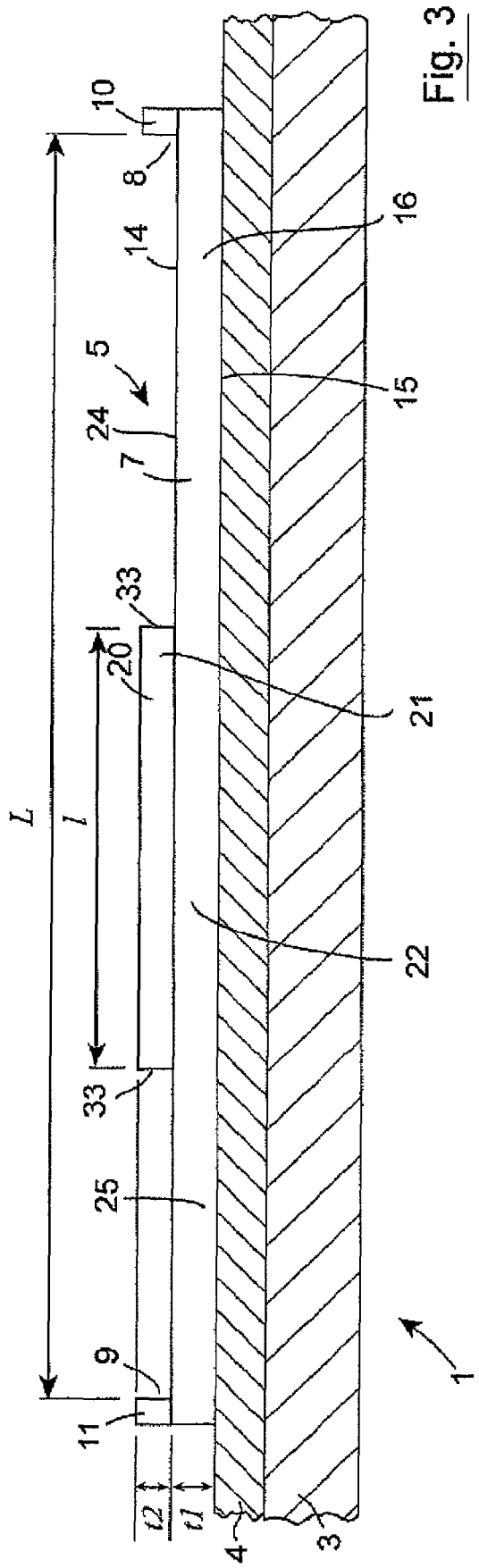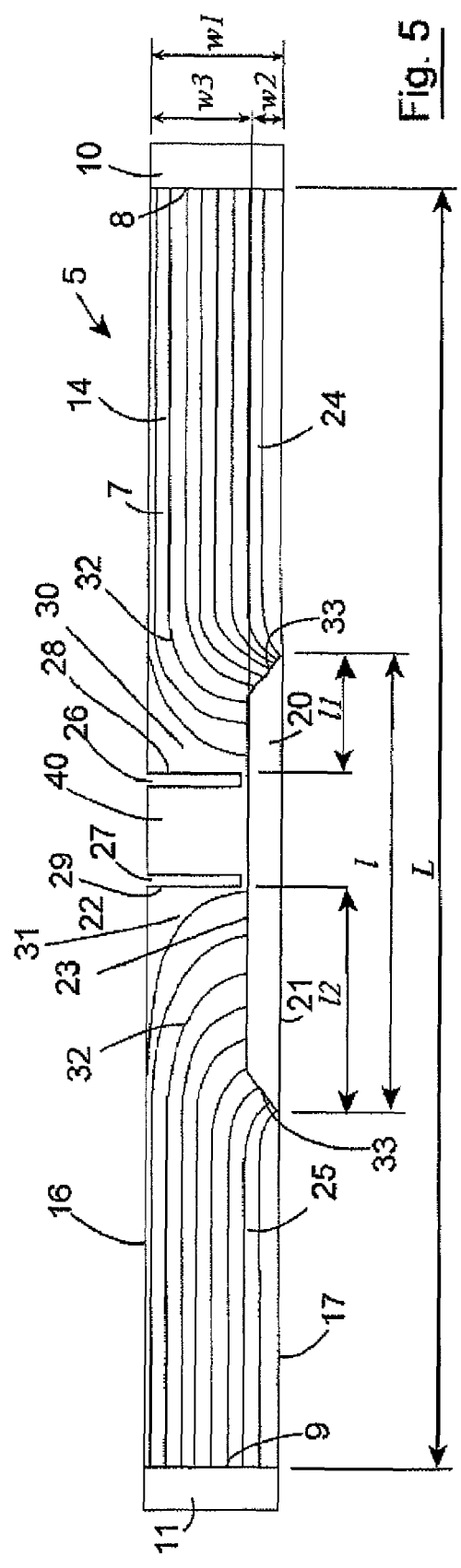

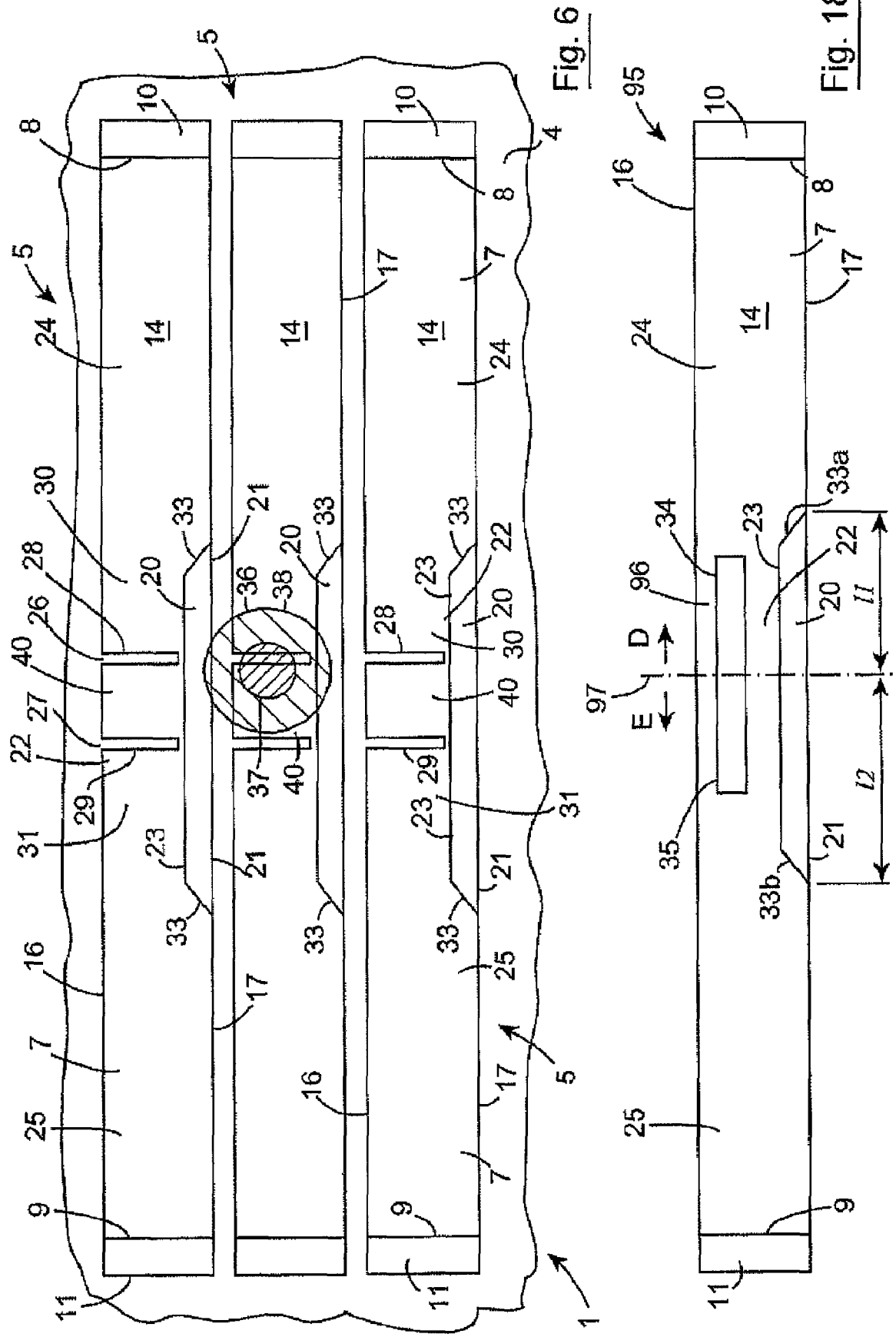

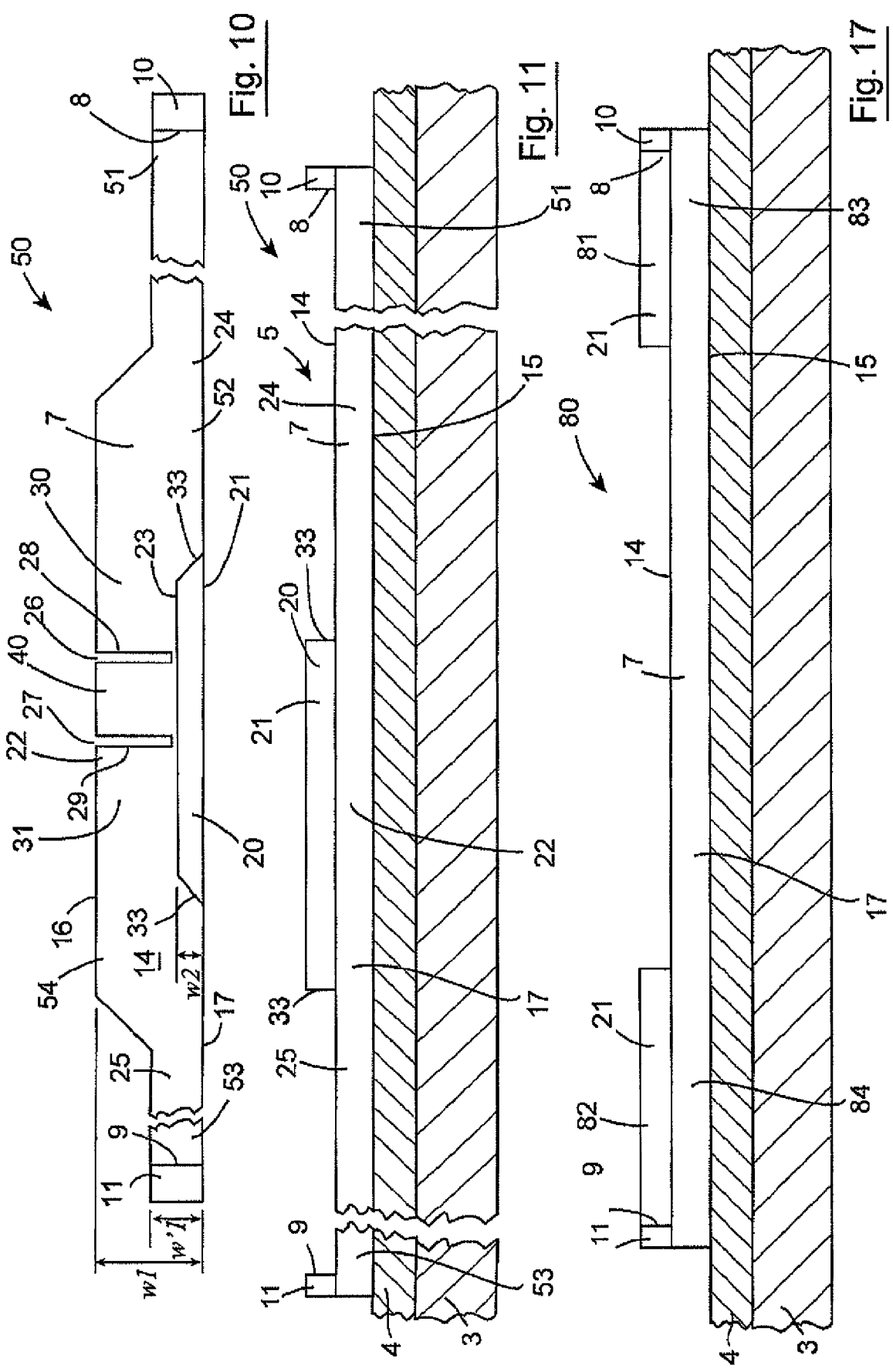

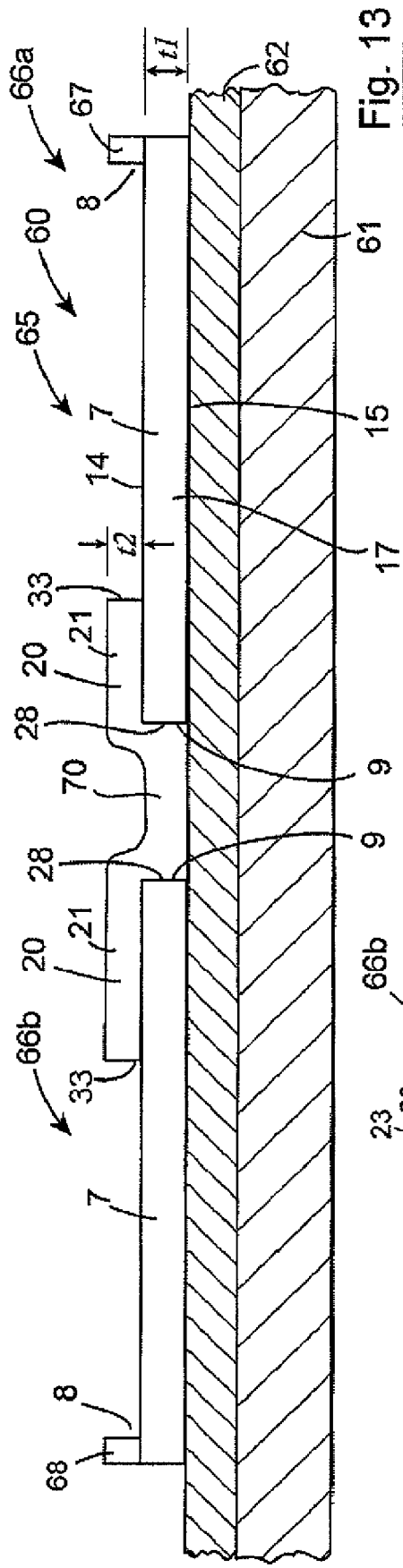
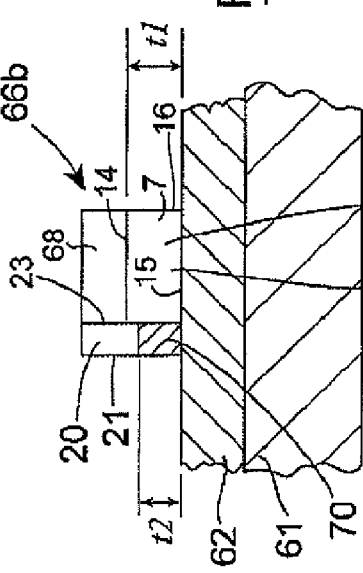
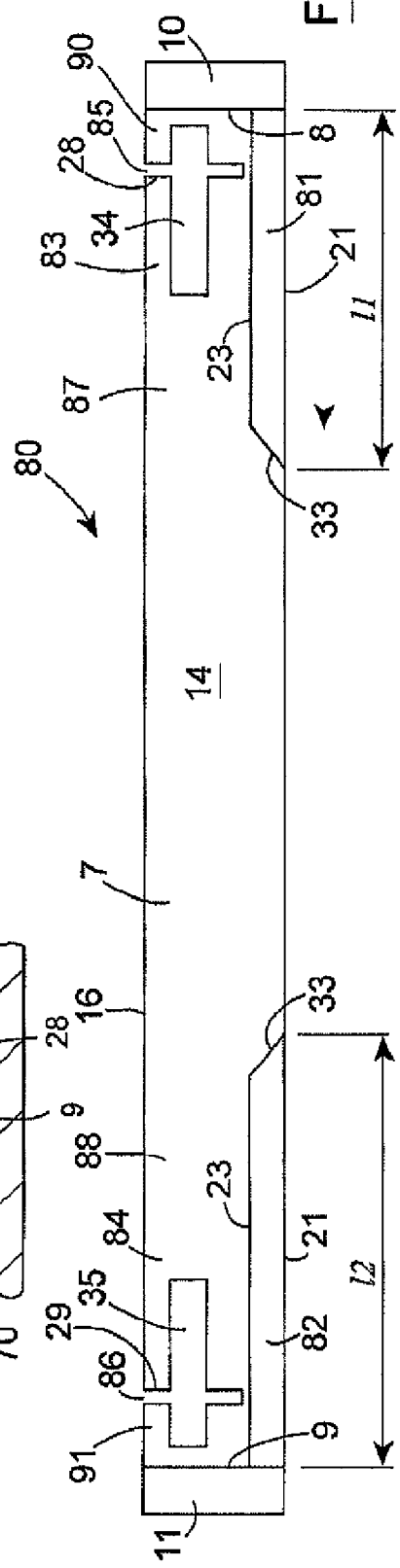

FILM RESISTOR AND A METHOD FOR FORMING AND TRIMMING A FILM RESISTOR

RELATED APPLICATION

This application is a divisional (DIV) of U.S. patent application Ser. No. 11/231,054, entitled "FILM RESISTOR AND A METHOD FOR FORMING AND TRIMMING A FILM RESISTOR," filed on Sep. 20, 2005, which is herein incorporated by reference in its entirety.

FIELD OF THE INVENTION

The present invention relates to a film resistor, and in particular, though not limited to, a thin film resistor. The invention also relates to an integrated circuit comprising a plurality of the film resistors, and the invention further relates to a method for forming and trimming a film resistor, and in particular, though not limited to a method for forming and trimming a thin film resistor on an integrated circuit.

BACKGROUND TO THE INVENTION

Thin film resistors are commonly used in integrated circuits. Typically, a plurality of thin film resistors are formed on an electrically insulating substrate layer, which typically is an oxide layer formed on the integrated circuit chip. The thin film resistors, in general are formed in a specific area on the substrate layer to, in general, extend parallel to each other. It is desirable that the thin film resistors be located relatively close to each other for two important reasons, firstly, to minimise the area occupied by the thin film resistors on the integrated circuit chip, in order to minimise the overall die area required, and secondly, to minimise the effect of process variations on the thin film resistors, which can result in mismatch and other related problems.

However, even locating the thin film resistors close to each other does not completely avoid the effects of process variation, which can result in mismatch of the resistors on the same chip, and from chip to chip. Thus, trimming of the resistance of thin film resistors must be carried out after the film resistors have been formed on the integrated circuit chip. This, thus, requires that provision must be made during the formation of the thin film resistors for facilitating subsequent trimming of the resistance of the film resistors.

One method for forming thin film resistors which lends itself to subsequent trimming requires that the thin film resistors be formed with a sidewardly projecting tab which is subsequently trimmed for increasing the resistance of the resistors. Such prior art thin film resistors are illustrated in FIG. 1 and are indicated by the reference numeral 100. Each thin film resistor 100 is formed on an electrically insulating substrate 101, which typically is of an oxide material, such as silicon dioxide. The thin film resistors may be of any suitable material, for example, silicon chrome, which may be doped or otherwise. The thin film resistors are typically formed by physical vapour deposition (PVD), by chemical vapour deposition (CVD) or by sputtering, and are deposited to a depth, which is maintained constant and depends on the process. The length and width of the thin film resistors are dictated by the desired resistance values of the resistors. Typically, such thin film resistors are deposited to a depth of up to 100 Angstroms. The thin film resistors 100 extend between respective pairs of electrical contact pads 102 and 103, and each thin film resistor 100 is provided with a sidewardly extending tab 104 for facilitating trimming of the resistance of the thin film resistor 100. In order to minimise the spacing between the thin film resistors 100, the thin film resistors 100 are arranged in pairs with the tabs 104 of adjacent pairs facing each other and being staggered along the respective lengths of the thin film resistors 100.

The effect of the tabs 104 on the thin film resistors 100 is to reduce the current density of current flowing through the thin film resistors 100 adjacent the area of the tabs 104, and thus trimming of the tabs 104 provides relatively high resolution trimming.

Trimming of each thin film resistor 100 is generally carried out by progressively extending a trimming slot 105 into the tab 104 of the thin film resistor 100 being trimmed. The trimming slots 105 are formed by a laser light beam, and in general are formed to extend parallel to the thin film resistors 100. By virtue of the fact that the current density is reduced in the thin film resistors 100 adjacent the area of the tabs 104, a relatively wide resistance value trim range is achievable, as well as relatively high trim resolution.

While alignment techniques for aligning a laser light beam with a tab 104 to be trimmed have been improved over the years, the size of the active high energy spot of the laser light beam which actually forms the trimming slot 105 is still relatively large, and accordingly, it is essential that the spacing between the tabs 104 of adjacent thin film resistors 100 must be sufficient to avoid any danger of the laser light beam as it is forming a trimming slot 105 in the tab 104 of one of the thin film resistors 100 damaging the adjacent thin film resistor 100. Typically, the high energy laser spot is of diameter of the order of three microns to five microns. Thus, while the spacing between the thin film resistors can be reduced somewhat by arranging the thin film resistors 100 with the tabs 104 of adjacent pairs of resistors facing each other, nonetheless, the thin film resistors 100 must be spaced apart a sufficient distance to avoid unintentional trimming of a thin film resistor 100 adjacent another thin film resistor 100 the tab 104 of which is being trimmed.

Typically, the transverse distance A between the tab 104 of one thin film resistor 100 and the adjacent thin film resistor 100 should be at least nine microns, while the longitudinal distance B between the tabs 104 of adjacent thin film resistors 100 should be of the order of ten microns. Additionally, the tab 104 of each thin film resistor 100 should be a longitudinal distance C from the closest electrical contact pad 102 or 103 of at least nine microns.

Accordingly, while this prior art method of forming and trimming thin film resistors provides a relatively wide trim range as well as relatively high trim resolution, nonetheless, it still requires a relatively large spacing between the thin film resistors, which in turn results in a relatively large die area to accommodate the thin film resistors, and potential mismatch between the thin film resistors.

There is therefore a need for a film resistor which addresses this problem.

The present invention is directed towards providing a film resistor which can be located relatively close to an adjacent film resistor, and which can be subsequently trimmed. The invention is also directed towards a method for forming and trimming such a film resistor, and the invention is also directed towards providing an integrated circuit comprising a plurality of film resistors formed thereon.

SUMMARY OF THE INVENTION

According to the invention there is provided a film resistor comprising:
a resistive film of electrically resistive material extending longitudinally between a first end and a spaced apart second end, and having opposite spaced apart first and second major surfaces extending between opposite spaced apart first and second side edges, the resistive film being adapted to accommodate current flow between the first and second ends, and
a low impedance element electrically coupled to the resistive film adjacent an intermediate portion of the resistive film disposed intermediate the first and second ends for conducting current in parallel with the intermediate portion of the resistive film for reducing current density of current flow in the intermediate portion for facilitating trimming of the resistance of the film resistor in the intermediate portion thereof.

In one embodiment of the invention the low impedance element is electrically coupled to the resistive film along the length of the intermediate portion in a direction between the first and second ends of the resistive film. Preferably, the low impedance element abuts and is electrically coupled to the first major surface of the resistive film along the intermediate portion. Advantageously, the low impedance element is laminated with the resistive film adjacent the intermediate portion.

Ideally, the low impedance element overlays the first major surface of the resistive film adjacent the intermediate portion, and is electrically coupled to the resistive film throughout the area thereof overlaid by the low impedance element.

In one embodiment of the invention the low impedance element is electrically coupled to the resistive film adjacent the second side edge thereof.

Preferably, the low impedance element is electrically coupled to the resistive film at a location spaced apart from the first side edge thereof and defines a trimmable portion in the intermediate portion between the low impedance element and the first side edge.

Advantageously, the resistance of the film resistor is trimmable by progressively extending a trimming slot in the trimmable portion.

In one embodiment of the invention a first transverse edge extends in the intermediate portion in a general direction from the first side edge of the resistive film to the low impedance element, the first transverse edge defining with the first side edge and the low impedance element a first trimmable area in the trimmable portion. Preferably, the resistance of the film resistor is trimmable by progressively extending a first trimming slot in the first trimmable area. Advantageously, the first trimming slot is extended into the first trimmable area from the first transverse edge.

In another embodiment of the invention a second transverse edge spaced apart from the first transverse edge extends in the intermediate portion in a general direction from the first side edge of the resistive film to the low impedance element, the second transverse edge defining with the first side edge and the low impedance element a second trimmable area in the trimmable portion. Preferably, the second transverse edge is disposed between the first transverse edge and the second end of the resistive film. Advantageously, the resistance of the film resistor is trimmable by progressively extending a second trimming slot in the second trimmable area. Preferably, the second trimmable slot is extended into the second trimmable area from the second transverse edge.

Ideally, one of the first and second trimming slots is extended into the corresponding one of the first and second trimmable areas for coarse trimming the resistance of the film resistor, and the other one of the first and second trimming slots is extended into the corresponding one of the first and second trimmable areas for fine trimming of the resistance of the film resistor.

In one embodiment of the invention the current density progressively reduces in the respective first and second trimmable areas towards the first side edge of the resistive film and the corresponding one of the first and second transverse edges.

Preferably, the resistive film is an elongated resistive film extending longitudinally between the first and second ends thereof.

In one embodiment of the invention the low impedance element is an elongated low impedance element extending longitudinally in a general direction parallel to the resistive film. Advantageously, the respective opposite ends of the low impedance element are shaped to minimise current crowding adjacent the ends thereof.

In one embodiment of the invention the respective opposite ends of the low impedance element are chamfered such that a side edge of the low impedance element disposed adjacent the second side edge of the resistive film is longer than an opposite side edge thereof disposed remote of the second side edge of the resistive film.

In another embodiment of the invention the low impedance element is more tolerant of the cutting effect of a laser light trimming beam than the resistive film.

In a further embodiment of the invention the low impedance element is of electrical resistance which is lower than the electrical resistance of the resistive film.

In one embodiment of the invention the resistive film is a thin film resistor.

In another embodiment of the invention a pair of low impedance elements are electrically coupled to the resistive film adjacent corresponding spaced part intermediate portions of the resistive film. Preferably, one of the low impedance elements and the corresponding intermediate portion is located adjacent on of the first and second ends of the resistive film, and the other one of the low impedance elements and the corresponding one of the intermediate portions is located adjacent the other one of the first and second ends of the resistive film.

The invention also provides a compound film resistor comprising a pair of film resistors according to the invention electrically coupled in series by the low impedance elements of the respective film resistor.

Additionally, the invention provides an integrated circuit comprising an electrically insulating substrate layer and a film resistor according to the invention formed on the substrate layer.

Further the invention provides an integrated circuit comprising an electrically insulating substrate, and a plurality of spaced apart film resistors according to the invention formed on the substrate layer with the second major surfaces of the resistive films abutting the substrate layer, and the resistive films extending parallel to each other with the first side edge of each resistive film lying adjacent but spaced apart from the second side edge of the adjacent resistive film.

The invention also provides a method for forming and trimming a film resistor, the method comprising the steps of:
forming a resistive film of electrically resistive material on an electrically insulating substrate, the resistive film extending between a first end and a spaced apart second end, and having opposite spaced apart first and second major surfaces extending between opposite spaced apart first and second side edges, the resistive film being adapted to accommodate current flow between the first and second ends, electrically coupling a low impedance element to the resistive film adjacent an intermediate portion of the resistive film disposed intermediate the first and second ends for conducting current in parallel with the intermediate portion of the resistive film for reducing current density of current flow in the intermediate portion for facilitating trimming of the resistance of the film resistor in the intermediate portion thereof, and trimming the resistance of the film resistor by progressively extending a trimming slot into the intermediate portion of the resistive film.

In one embodiment of the invention the low impedance element is electrically coupled to the resistive film at a location spaced apart from the first side edge thereof and defines a trimmable portion in the intermediate portion between the low impedance element and the first side edge.

In another embodiment of the invention a first transverse edge is formed in the intermediate portion extending in a general direction from the first side edge of the resistive film to the low impedance element, the first transverse edge defining with the first side edge and the low impedance element a first trimmable area in the trimmable portion. Preferably, the first trimmable area is trimmed by progressively extending a first trimming slot in the first trimmable area. Advantageously, the first trimming slot is extended into the first trimmable area from the first transverse edge. Ideally, the first trimming slot is progressively extended in the first trimmable area parallel to the first side edge of the resistive film.

In another embodiment of the invention a second transverse edge spaced apart from the first transverse edge is formed in the intermediate portion extending in a general direction from the first side edge of the resistive film to the low impedance element, the second transverse edge defining with the first side edge and the low impedance element a second trimmable area in the trimmable portion. Preferably, the second trimmable area is trimmed by progressively extending a second trimming slot in the second trimmable area. Advantageously, the second trimming slot is extended into the first trimmable area from the second transverse edge. Ideally, the second trimming slot is progressively extended in the second trimmable area parallel to the first side edge of the resistive film.

Ideally, one of the first and second trimming slots is extended into the corresponding one of the first and second trimmable areas for coarse trimming the resistance of the film resistor, and the other one of the first and second trimming slots is extended into the corresponding one of the first and second trimmable areas for fine trimming of the resistance of the film resistor.

ADVANTAGES OF THE INVENTION

The advantages of the invention are many. However, one of the most important advantages of the invention is that the invention provides film resistors, and in particular thin film resistors, which can be located on an integrated circuit considerably more closely together than known thin film resistors can be located heretofore, without any loss in the resolution at which the resistors can be trimmed. Indeed, many of the configurations of the film resistor according to the invention facilitate higher resolution trimming than can be achieved with film resistors known heretofore, and where the film resistors are configured for facilitating separate coarse and fine trimming, particularly high resolution trimming can be achieved. The film resistors according to the invention also have a relatively wide trim range of resistance values, and this is particularly so in the film resistors which are configured to facilitate separate coarse and fine trimming.

By virtue of the fact that the thin film resistors can be located significantly more closely together than many prior art thin film resistors, a significant reduction in die area is achieved. Where the low impedance elements overlay the resistive film of the film resistors, a particularly large reduction in the die area requirement is achieved. Furthermore, where the low impedance elements overlay the resistive film of the thin film resistors, and the low impedance elements are of material which is more tolerant of the cutting effect of a laser light trimming beam than the resistive film, the thin film resistors can be located more closely to each other than would otherwise be possible. This is achievable by locating the thin film resistors so that the low impedance elements of the respective thin film resistors are adjacent but spaced apart from the intermediate portion, namely, the trimmable area of the adjacent thin film resistor. Thus, as each thin film resistor is being trimmed, there is little danger of damage being caused to the adjacent thin film resistor, even if the laser light trimming beam is not entirely accurately aligned during trimming, since the part of the adjacent thin film resistor which is adjacent the trimmable area being trimmed is the low impedance element, which is more tolerant of the laser light trimming beam than the resistive film. Thus, by providing the low impedance element to be of material which is more tolerant of the laser light beam than the resistive film, a further reduction in the die area is achieved.

Additionally, by virtue of the fact that the thin film resistors can be located particularly closely together, mismatch between the thin film resistors prior to trimming resulting from process variations is significantly reduced, thereby minimising the subsequent trimming requirements.

A further advantage which is achievable by the invention is that the thin film resistors can be more accurately matched, since they can be located in similar orientations. In other words, the respective thin film resistors can be, and are preferably located with the low impedance element of each thin film resistor adjacent the intermediate portion of the adjacent thin film resistor. Additionally, by so locating the thin film resistors relative to each other, setting up of the laser trim apparatus for trimming the thin film resistors is significantly simplified, since by locating the thin film resistors in the same orientation relative to each other, and spacing the thin film resistors at a constant pitch, the setting up of the laser trimming apparatus to sequentially thin the thin film resistors merely requires indexing the laser light trimming beam in steps of constant pitch from one thin film resistor to the next.

The invention and its many advantages will be readily apparent to those skilled in the art from the following description of some preferred embodiments thereof, which are given by way of example only, with reference to the accompanying drawings.

BRIEF DESCRIPTION OF THE DRAWINGS

FIG. 2 is a top plan view of a portion of an integrated circuit according to the invention comprising a plurality of thin film resistors also according to the invention, FIG. 3 is a transverse cross-sectional side elevational view of the portion of the integrated circuit of FIG. 2 on the line III-III of FIG. 2, is FIG. 5 is a top plan view of one of the thin film resistors according to the invention of the integrated circuit of FIG. 2, FIG. 6 is a top plan view of the portion of the integrated circuit of FIG. 2 illustrating trimming of the resistance of one of the thin film resistors of the integrated circuit of FIG. 2, FIG. 7 is a top plan view of one of the thin film resistors of the integrated circuit of FIG. 2 after the resistance of the thin film resistor has been trimmed, FIG. 10 is a top plan view of a thin film resistor according to another embodiment of the invention, FIG. 11 is a transverse cross-sectional side elevational view of the thin film resistor of FIG. 10 illustrated on a portion of an integrated circuit, FIG. 13 is a transverse cross-sectional side elevational view of the integrated circuit of FIG. 12 on the line XIII-XIII of FIG. 12, FIG. 14 is a transverse cross-sectional end elevational view of a portion of the portion of the integrated circuit of FIG. 12 on the line XIV-XIV of FIG. 12, FIG. 16 is a top plan view of a thin film resistor according to a further embodiment of the invention, FIG. 17 is a side elevational view of the thin film resistor of FIG. 16 illustrated on a portion of an integrated circuit, and FIG. 18 is a top plan view of a thin film resistor according to another embodiment of the invention.

DETAILED DESCRIPTION OF PREFERRED EMBODIMENTS OF THE INVENTION

Figure 1:
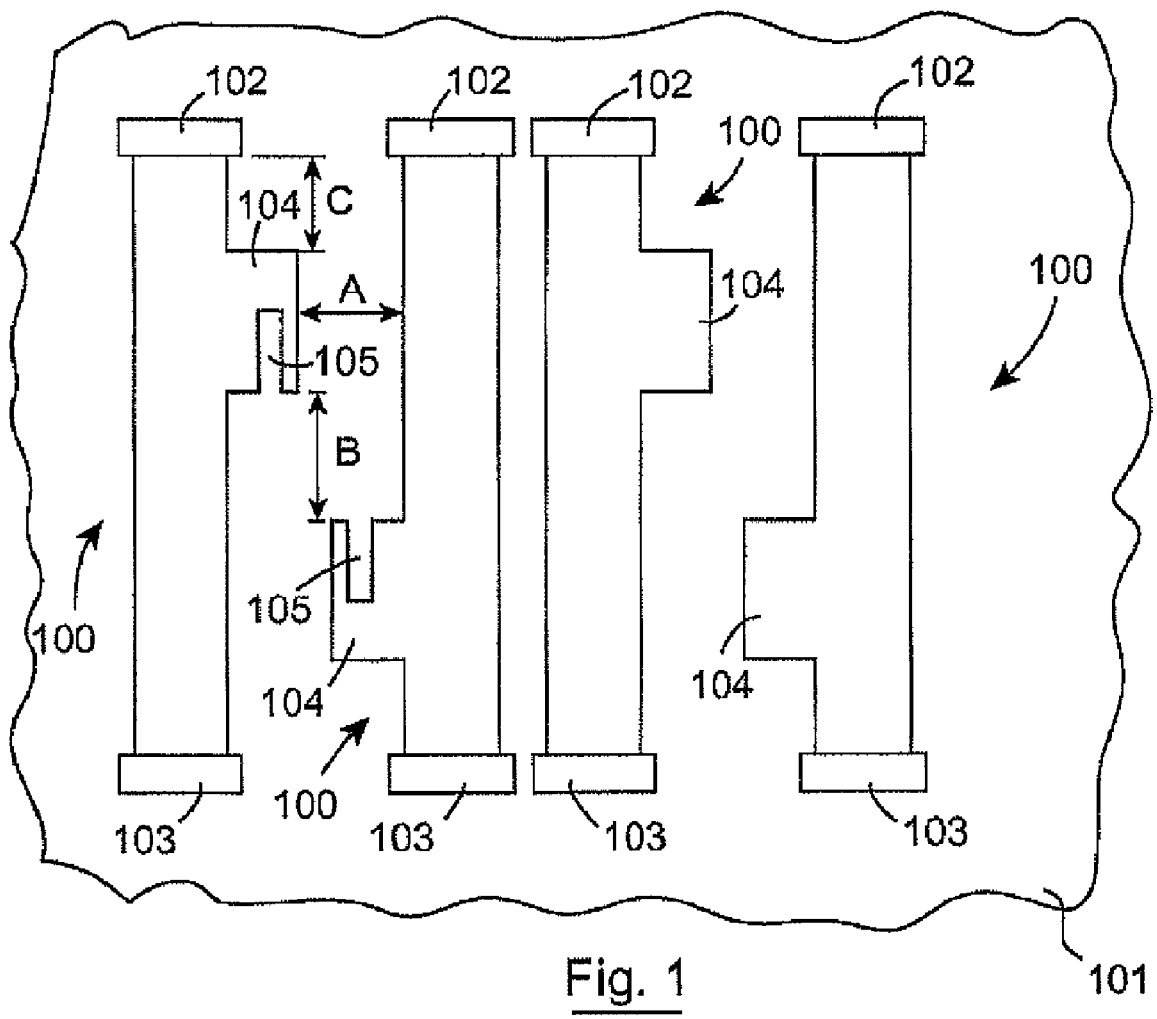
FIG. 1 is a top plan view of prior art thin film resistors on a portion of an integrated circuit chip.
Figure 4:
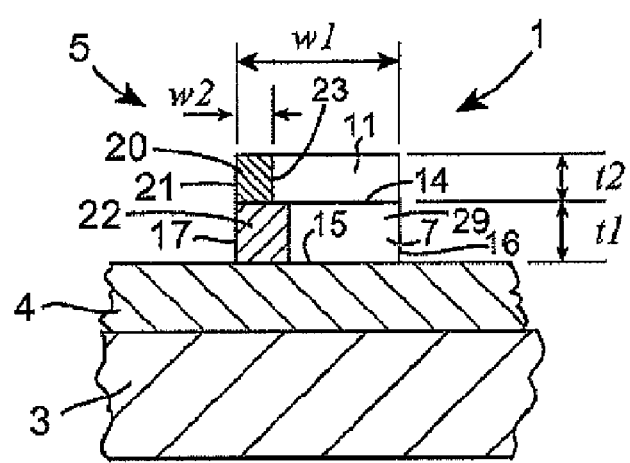
FIG. 4 is a transverse cross-sectional end view of a portion of the portion of the integrated circuit of FIG. 2 on the line IV-IV of FIG. 2.

Referring to the drawings, which are not to scale, and initially to FIGS. 2 to 7, there is illustrated a portion of an integrated circuit according to the invention, indicated generally by the reference numeral 1 which comprises a substrate 3 of silicon within which components (not shown) of the integrated circuit 1 are formed. An electrically insulating layer 4 of silicon dioxide is formed on the substrate 3, and a plurality of thin film resistors also according to the invention, indicated generally by the reference numeral 5, are formed on the insulating layer 4, and extend parallel to each other. Since the invention relates to the thin film resistors 5, other components of the integrated circuit 1 will not be described, however, such components will be well known to those skilled in the art, and will be appropriate to the particular integrated circuit.

Each thin film resistor 5 comprises an elongate resistive film 7 of an electrically resistive material which will be described in more detail below, and which extends longitudinally between a first end 8 and a second end 9. The first end 8 and the second end 9 of each resistive film 7 are electrically coupled to first and second electrical contact pads 10 and 11, respectively, and each resistive film 7 accommodates flow of electrical current between the corresponding pair of first and second contact pads 10 and 11. Each resistive film 7 has a first or top major surface 14 and an opposite spaced apart second or bottom major surface 15 which extend between opposite spaced apart first and second side edges 16 and 17, respectively.

An elongate low impedance element 20 is formed on and electrically coupled to the top major surface 14 of the resistive film 7 of each thin film resistor 5 intermediate the first and second ends 8 and 9. Each low impedance element 20 extends along and defines an intermediate portion 22 of the resistive film 7 and conducts current in parallel with the corresponding intermediate portion 22 for reducing the current density of current flow in the intermediate portion 22 for facilitating trimming of the resistance of the thin film resistor 5 in the intermediate portion 22, as will be described in more detail below. The low impedance element 20 of each thin film resistor 5 extends the length of the corresponding intermediate portion 22, and extends longitudinally along and parallel to the second side edge 17 of the corresponding resistive film 7 with a first side edge 21 of the low impedance element 20 coinciding with the second side edge 17 of the resistive film 7. Each low impedance element 20 is located on the corresponding resistive film 7 with a second side edge 23 thereof spaced apart from the first side edge 16 of the resistive film 7 for defining a trimmable portion in the intermediate portion 22, as will be described below between the second side edge 23 of the low impedance element 20 and the first side edge 16 of the resistive film 7. Each low impedance element 20 is essentially laminated with the corresponding resistive film 7, and is in electrical contact with the resistive film 7 over the entire area of the resistive film 7 overlaid by the low impedance element 20. Thus, the majority of the current being conducted through each resistive film 7 is carried by the corresponding low impedance element 20 in the area of the intermediate portion 22, and the current density in the intermediate portion 22 is significantly less than in first and second portions 24 and 25, respectively, of the resistive film 7, which extend between the intermediate portion 22 and the first and second ends 8 and 9, respectively.

Spaced apart first and second transverse edge forming slots 26 and 27, respectively, extend inwardly into the resistive film 7 in the intermediate portion 22 of each thin film resistor 5 perpendicularly from the first side edge 16 towards the second side edge 17, and terminate adjacent the second side edge 23 of the corresponding low impedance element 20. The first and second transverse edge forming slots 26 and 27 form first and second transverse edges 28 and 29, respectively, in the resistive films 7. The first transverse edge 28 of each resistive film 7 defines with the first side edge 16 of the resistive film 7 and the second side edge 23 of the corresponding low impedance element 20 a first trimmable area 30 in the trimmable portion of the intermediate portion 22. The second transverse edge 29 of each resistive film 7 defines with the first side edge 16 of the resistive film 7 and the second side edge 23 of the corresponding low impedance element 20 a second trimmable area 31 also in the trimmable portion of the intermediate portion 22. The first and second trimmable areas 30 and 31 are of reduced current density for facilitating coarse and fine trimming of the thin film resistors 5. Current density lines 32 in FIGS. 5 and 7 illustrate the variation in current density in the first and second trimmable areas 30 and 31. The current density progressively decreases in each of the first and second trimmable areas 30 and 31 from the corresponding low impedance element 20 to the first side edge 16 of the resistive film 7 in the intermediate portion 22, and towards the corresponding one of the first and second transverse edges 28 and 29.

In this embodiment of the invention coarse trimming is carried out in the first trimmable area 30, and fine trimming is carried out in the second trimmable area 31. The trimming is carried out by progressively extending first and second trimming slots 34 and 35 parallel to and spaced apart from the first side edge 16 into the first and second trimmable areas 30 and 31, respectively, from the respective first and second transverse edges 28 and 29, see FIG. 7. The trimming, in this embodiment of the invention, is carried out with a laser light trimming beam. Initially, the first trimming slot 34 is progressively extended from the first transverse edge 28 of the intermediate portion 22 of the thin film resistor 5 being trimmed into the first trimmable area 30 for coarse trimming of the thin film resistor 5. The trimming of the first trimmable area 30 continues by progressively extending the first trimming slot 34 into the first trimmable area 30 until the resistance of the thin film resistor 5 is increased to a level just below the desired resistance. Thereafter, fine trimming is carried out by progressively extending the second trimming slot 35 into the second trimmable area 31 from the second transverse edge 29. The second trimming slot 35 is progressively extended into the second trimmable area 31 until the resistance of the thin film resistor 5 is at the desired resistance value.

In this embodiment of the invention, since the fine trimming is carried out in the second trimmable area 31 of each thin film resistor 5, the length of each second trimmable area 31 from the second transverse edge 29 in a direction towards the second end 9, which is determined by the length l2 of the corresponding low impedance element 20 from the second transverse edge 29 in the direction towards the second end 91 is longer than the length of the first trimmable area 30 from the first transverse edge 28 in a direction towards the first end 8, which is determined by the length l1 of the low impedance element 20 from the first transverse edge 28 in the direction towards the first end 8. This, as will be described below, provides for higher resolution trimming in the second trimmable area 31 than in the first trimmable area 30.

By virtue of the fact that each low impedance element 20 is electrically coupled to the corresponding resistive film 7 along the length of the intermediate portion 22, the current density in the first and second trimmable areas 30 and 31 progressively decreases towards the corresponding first and second transverse edges 28 and 29. Thus, as the first trimming slot 34 is progressively extended into the first trimmable area 30, the increase in resistance of the thin film resistor 5 obtained per unit increase in the length of the first trimming slot 34 increases as the length of the first trimming slot 34 increases. Thus, the resolution of the trimming as the first trimming slot 34 is progressively extended into the first trimmable area 30 reduces. However by continuing the coarse trim in the first trimmable area 30 until the resistance of the thin film resistor 5 is increased to a value just below the desired resistance value, fine trimming can then be carried out in the second trimmable area 31 in the area towards the second transverse edge 29 where the current density is lowest, since only a small increase in the resistance of the thin film resistor 5 will be required from the fine trimming. Once the second trimming slot 35 extending into the second trimmable area 31 is relatively short relative to the length l2 of the low impedance element 20 from the second transverse edge 29, trimming in the second trimmable area 31 is carried out where the current density is relatively low, and thus the resolution of the fine trimming will be relatively high. This is described in more detail below with reference to FIGS. 8 and 9.

The longer the low impedance element 20 extends along the corresponding resistive film 7 from the first and second transverse edges 28 and 29 towards the first and second ends 8 and 9, respectively, the lower will be the current density in the first and second trimmable areas 30 and 31 adjacent the first and second transverse edges 28 and 29, and thus the higher will be the achievable trim resolution in the first and second trimmable areas 30 and 31 in the areas adjacent the first and second transverse edges 28 and 29, respectively. However, before describing trimming of the thin film resistors 5 in further detail, the resistive films 7 and the low impedance elements 20 of the thin film resistors 5 will first be described in more detail.

The resistive film 7 of each thin film resistor 5, as discussed above, is of an electrically resistive material, which in general will be determined by the desired resistance value of the thin film resistor 5. However, typical electrically resistive materials are silicon-chrome, nickel-chrome and titanium-silicon, which may or may not be doped, and typically are deposited on the insulating layer 4 by a PVD or a CVD process. The material which is to form the resistive films 7 is deposited to a constant depth t1 which is determined by the deposition process. Typically, the material is deposited to a depth to form the resistive films 7 of depth t1 of up to 100 Angstroms, and more typically, of depth t1 in the range of 20 to 50 Angstroms. Each resistive film 7 is of length L and width w1, both of which are largely dictated by the desired resistance value of the thin film resistors 5. The width w1 of such resistive films can vary anywhere from 0.1 micron to 36 microns, and even greater, although, more typically the width w1 of such resistive films lies in the range of 1 micron to 36 microns.

The material of the low impedance element 20 of each thin film resistor 5 is of relatively high conductivity, and typically, of a few orders of magnitude higher than the conductivity of the material of the resistive film 7, so that most of the current flowing through the thin film resistor 5 is conducted through the corresponding low impedance element 20. In a typical preferred case the conductivity of the low impedance element 20 of each thin film resistor 5 is two orders of magnitude greater than the conductivity of the resistive film 7. Additionally, the material of the low impedance elements 20 may have a higher resistance to the cutting effect of a laser light trimming beam than that of the resistive films 7, in order to permit the thin film resistors 5 to be located more closely to each other, as will be described below. Materials with greater resistance to the cutting effect of a laser light trimming beam than the materials of the resistive films, which are suitable for the low impedance elements 20 are titanium-tungsten, titanium-nitride, tungsten, aluminium-silicon-copper, aluminium-silicon, aluminium-copper and aluminium. The material forming the low impedance elements 20 is deposited directly onto the top major surface 14 of the resistive films 7 of the thin film resistors 5 by a PVD or a CVD process. By forming the low impedance elements 20 directly onto the corresponding resistive films 7, electrical contact is ensured between each low impedance element 20 and the corresponding resistive film 7 over the entire area of the resistive film 7 overlaid by the low impedance element 20.

The low impedance elements 20 are deposited to a constant depth t2, which is determined by the deposition process. Each low impedance element 20 is of length l and width w2. The width w2 of each low impedance element 20 is dictated by the conductivity required, as well as by the width w1 of the corresponding resistive film 7, in order that the corresponding first and second trimmable areas 30 and 31 are of width w3, which is sufficient to allow for trimming. Indeed, it is desirable that the width w2 of each low impedance element is considerably less than the width w1 of the corresponding resistive film 7 in order to form the first and second trimmable areas 30 and 31 to be of sufficient width w3 to facilitate trimming of the first and second trimmable areas 30 and 31. Additionally, by minimising the width w2 of each low impedance element 20, the overall width w1 of the corresponding resistive film 7 can be minimised. The length l of each low impedance element 20 is dictated by the trimming resolution required and the spacing between the first and second trim slots 34 and 35. The length l1 of each low impedance element 20 from the first transverse edge 28 along the first trimmable area 30, and the length l2 of each low impedance element 20 from the second transverse edge 29 along the second trimmable area 31 are dictated by the trim resolution required, the longer the lengths l1 and l2 of the low impedance element 20, the higher will be the trim resolution and the greater will be the trim range. In this embodiment of the invention as discussed above, since coarse trimming is being carried out in the first trimmable area 30 of each thin film resistor 5, and fine trimming is being carried out in the second trimmable area 31 of each thin film resistor 5, the length l2 of each low impedance element 20 is longer than its length l1.

Ends 33 of each low impedance element 20 are shaped in order to minimise current crowding in the corresponding resistive film 7 adjacent the ends 33. In this embodiment of the invention the shaping is carried out by chamfering the ends 33 of each low impedance element 20 inwardly towards each other from the first side edge 21 of the low impedance element 20, which is adjacent the second side edge 17 of the corresponding resistive film 7 towards the second side edge 23 of the low impedance element 20 at an angle relative to the first side edge 21 of the low impedance element 20 of approximately 45°, although the chamfer angle may lie in the range from just greater than 0° to just less than 90°.

The first and second transverse edge forming slots 26 and 27 are etched in the resistive films 7 of the thin film resistors 5 at a suitable time in the forming process of the thin film resistors 5 by a suitable etching process, which will be well known to those skilled in the art.

Referring now in particular to FIG. 6, a representation of the trim spot 36 of a laser light beam directed onto the intermediate portion 22 of the resistive film 7 of one of the thin film resistors 5 for trimming thereof is illustrated. The trim spot 36 has a high energy centre spot 371 which is the active part of the trim spot 36 for cutting the respective first and second trim slots 34 and 35, and an outer low energy halo 38 extending around the high energy centre spot 37. Typically, the high energy centre spot 37 is of diameter in the range 3 microns to 5 microns and the outer diameter of the halo 38 of the trim spot 36 is approximately 7.5 microns. The width w4 of the first and second trimming slots 34 and 35 formed by the high energy centre spot 37 is approximately 3 microns to 5 microns also. The trimming is carried out in the first and second trimmable areas 30 and 31 by progressively extending the first and second trimming slots 34 and 35 into the first and second trimmable areas 30 and 31, respectively, in incremental steps of 0.1 microns in a general longitudinal direction from the corresponding first and second transverse edges 28 and 29 substantially parallel to the first side edge 16 of the resistive film 7. By extending the first and second trimming slots 34 and 35 into the first and second trimmable areas 30 and 31 parallel to the first side edge 16 of the corresponding resistive film 7, the width w3 of the first and second trimmable areas 30 and 31 can be minimised, and in turn the overall width w1 of the resistive film 7 can be minimised.

The first and second transverse edge forming slots 26 and 27 form therebetween a focusing area 40 in the intermediate portion 22 of each of the thin film resistors 5, within which the high energy centre spot 37 of the laser light trimming beam can be focused and aligned prior to forming the first and second trimming slots 34 and 35 in the first and second trimmable areas 30 and 31, respectively, of the thin film resistor 5 to be trimmed. The first and second transverse edge forming slots 26 and 27 should be sufficiently spaced apart so that the distance between the first and second transverse edges 28 and 29 is sufficient for facilitating focusing of the laser light trimming beam in the focusing area 40 and alignment of laser light trimming beam with the first and second trimmable areas 30 and 31 prior to commencement of cutting of the first and second trimming slots 34 and 35. The focusing area 40 has little or no effect on the resistance of the thin film resistor 5, and thus may be burned off during focusing of the laser light trimming beam.

Where the low impedance elements 20 are of a material which is more tolerant of the cutting effect of the laser light trimming beam than the material of the resistive films 7, and the thin film resistors 5 are located and oriented with the low impedance elements 20 of each thin film resistor 5 adjacent the first and second trimmable areas 30 and 31 of the adjacent thin film resistor 5, the thin film resistors 5 can be located particularly closely together without risk of damaging a thin film resistor while an adjacent thin film resistor is being trimmed. Even if the laser light trimming beam is not altogether accurately aligned with the first and second trimmable areas 30 and 31 of the thin film resistor 5 being trimmed, and the laser light trimming beam were to encroach on the adjacent thin film resistor 5, the laser light trimming beam would fall on an adjacent portion of the low impedance element 20 of the adjacent thin film resistor 5, and since the low impedance element 20 is more tolerant of the cutting effect of the laser light trimming beam than the material of the resistive film 7, no damage would result to the thin film resistor 5 adjacent the first and second trimmable areas 30 and 31 of the adjacent thin film resistor 5 being trimmed. Accordingly, by forming the low impedance elements 20 of material of greater resistance to the cutting effect of the laser light trimming beam than that of the material of the resistive films 7, the thin film resistors 5 can be located relatively closely together, and closer together than if the low impedance elements 20 were of a material which was not more tolerant of the cutting effect of the laser light trimming beam than that of the material of the resistive films 7. However, even where the low impedance elements 20 are not of a material which is more tolerant of the cutting effect of the laser light trimming beam than that of the material of the resistive films 7, the thin film resistors according to the invention can still be located considerably more closely together than many thin film resistors known heretofore.

In fact, in practice it has been found that in an integrated circuit having a fourteen-bit, seven-segment DAC implemented in R2R configuration where the resistors are implemented as thin film resistors according to the invention with the low impedance elements being of a material not being more tolerant of the cutting effect of the laser light trimming beam than the resistive films, the die area requirement for the thin film resistors is 400 microns by 273 microns. This compares with a die area requirement of 1,100 microns by 400 microns using prior art tab type thin film resistors of the type illustrated in FIG. 1. However, by implementing the DAC with thin film resistors according to the invention with the low impedance elements of material which is more tolerant of the cutting effect of the laser light trimming beam than the material of the resistive films, the die area requirement for the thin film resistors is further reduced to an area of 224 microns by 181 microns. Thus, the die area reduction achieved by using the thin film resistors according to the invention with the low impedance elements of material which is more tolerant of the cutting effect of the laser light trimming beam than the material of the resistive films, results in a very significant 91% reduction in the die area requirement. Even when the low impedance elements are of a material which is not more tolerant of the cutting effect of the laser light trimming beam than the material of the resistive films, the thin film resistors according to the invention result in a significant 75% reduction in the die area requirement.

Figure 8:
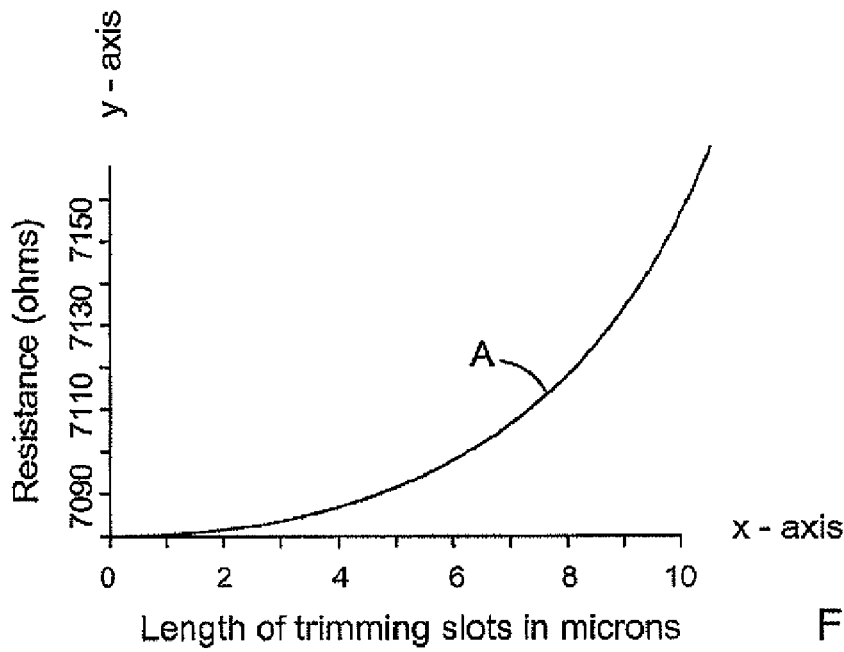
FIG. 8 is a waveform illustrating how the resistance of one of the thin film resistors of the integrated circuit of FIG. 2 increases as trimming of the thin film resistor progresses.

Referring now to FIG. 8, there is illustrated a waveform A showing how the resistance of one of the thin film resistors 5 progressively increases per unit increase in the length of the first trimming slot 34 as the length of the first trimming slot 34 is progressively increased in the first trimmable area 30. Resistance in ohms is plotted on the Y-axis, while the length of the first trimming slot 34 from the first transverse edge 28 into the first trimmable area 30 in microns is plotted on the X-axis. Initially, the increase in resistance of the thin film resistor 5 per unit increase in the length of the first trimming slot 34 is relatively low for the first 4 microns, approximately, of the first trimming slot 34 from the first transverse edge 28. However, thereafter the increase in the resistance obtained from each unit increase in the length of the first trimming slot 34 progressively increases as the length of the first trimming slot 34 increases at a considerably more rapid rate. Thus, as the length of the first trimming slot 34 increases from the first transverse edge 28, the resolution of the trim decreases per unit increase in the length of the first trimming slot 34. However, while the trim resolution decreases per unit increase in the length of the first trimming slot 34, the trim resolution is relatively high for the first 4 microns approximately of the first trimming slot 34. Thereafter, however, the rate of decrease in the trim resolution is more rapid as the length of the first trimming slot 34 is increased.

Since the length l2 of the portion of the low impedance element 20 extending along the second trimmable area 31 of each thin film resistor 5 is greater than the length l1 of the portion of the low impedance element 20 extending along the first trimmable area 30, the trim resolution achievable by the second trimming slot 35 in the second trimmable area 31 is higher per unit length of the second trimming slot 35 from the second transverse edge 29, micron for micron, compared with the trim resolution achievable by the first trimming slot 34 in the first trimmable area 30 from the first transverse edge of each thin film resistor 5.

Accordingly, by using the first trimming slot 34 to coarse trim each thin film resistor 5 by extending the first trimming slot 34 into the first trimmable area 30 to a length which raises the resistance of the thin film resistor 5 to a level just below the desired resistance value, even if the coarse trimming requires extending the first trimming slot 34 to a length greater than 6 microns, coarse trimming can still be achieved by extending the first trimming slot 34 to a length up to approximately 9 microns to 10 microns from the first transverse edge 28, see FIG. 8. Thereafter, fine trimming can then be carried out by extending the second trimming slot 35 into the second trimmable area 31 from the second transverse edge 29. If the coarse trimming has raised the resistance of the thin film resistor 5 to just below the desired resistance value, fine trimming in the second trimmable area 31 should be achieved within the first 5 microns of length of the second trimming slot 35, thereby permitting the fine trimming to be carried out with relatively high resolution.

Figure 9:
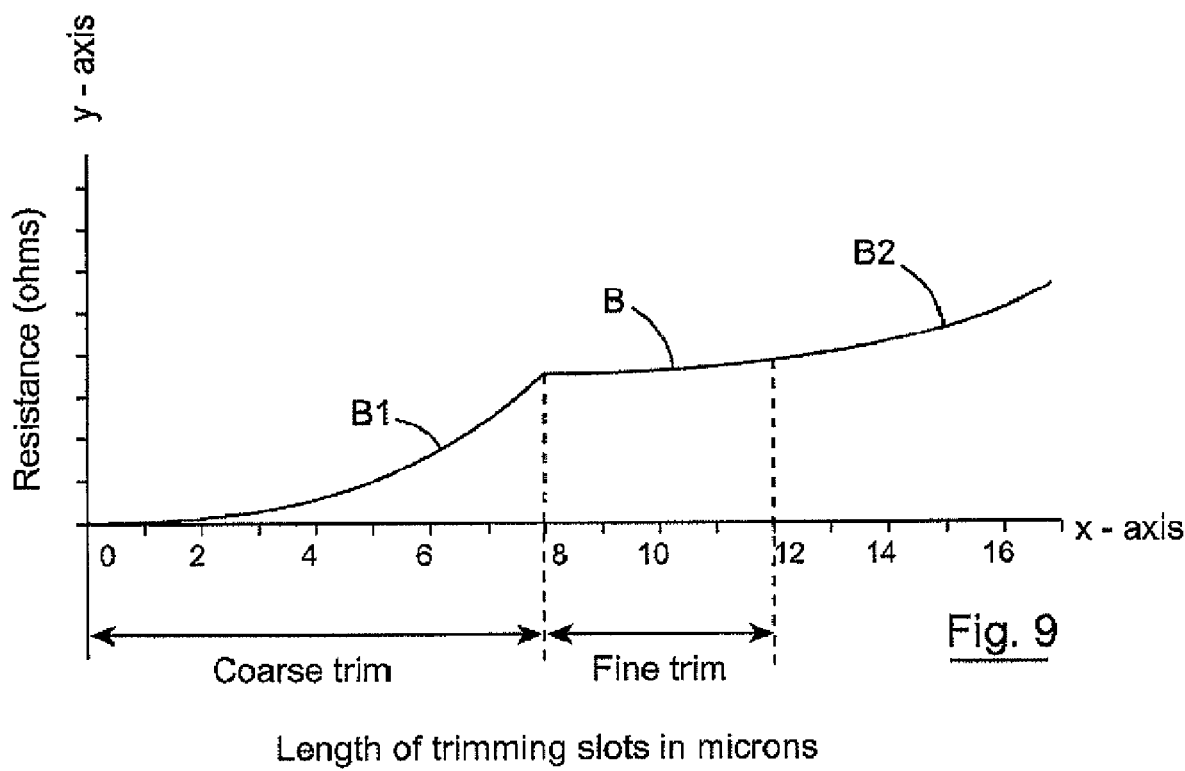
FIG. 9 is a waveform illustrating the increase in resistance of one of the thin film resistors of the integrated circuit of FIG. 2 during a typical trimming of the resistance of the thin film resistor.

Referring now to FIG. 9, a waveform B illustrates the increase in the resistance during trimming of a typical one of the thin film resistors 5. The portion B1 of the waveform B represents the coarse trimming, while the portion B2 of the waveform B represents the fine trimming. Initially coarse trimming of the thin film resistor 5 is carried out in the first trimmable area 30 by progressively extending the first trimming slot 34 into the first trimmable area 30 until the resistance of the thin film resistor 5 is just below the desired resistance value. In this case, the first trimming slot 34 is extended into the first trimmable area 30 for a length of almost 8 microns. Fine trimming is then carried out in order to bring the resistance value of the thin film resistor 5 up to the desired resistance value. This is carried out by extending the second trimming slot 35 into the second trimmable area 31 until the resistance value of the thin film resistor 5 is of the desired value. In this particular case, the second trimming slot is extended into the second trimmable area 31 a distance of approximately 4 microns.

As can be seen from the portion B2 of the waveform B, the increase in the resistance of the thin film resistor 5 obtained per unit increase in the length of the second trimming slot 35 progressively increases as the length of the second trimming slot 35 is increased. However, the rate of increase in the resistance of the thin film resistor 5 obtained per unit increase in the length of the second trimming slot 35 as the length of the second trimming slot 35 is increased, is considerably less than the rate of increase in the resistance of the thin film resistor 5 obtained per unit increase in the length of the first trimming slot 34 as the first trimming slot 34 is increased. This results from the fact that the length l2 of the low impedance element 20 extending from the second transverse edge 29 along the second trimmable area 31 is greater than the length l1 of the low impedance element 20 extending from the first transverse edge 28 along the first trimmable area 30. By virtue of the fact that the rate of increase in the resistance of the thin film resistor 5 obtained per unit increase in the length of the second trimming slot 35 as the length of the second trimming slot 35 is increased, is less than the corresponding rate of increase in the resistance of the thin film resistor 5 as the length of the first trimming slot 34 is increased, higher trim resolution is provided in the second trimmable area 31 than in the first trimmable area 30.

Referring now to FIGS. 10 and 11, there is illustrated a thin film resistor according to another embodiment of the invention, indicated generally by the reference numeral 50. The thin film resistor 50 is substantially similar to the thin film resistor 5 described with reference to FIGS. 2 to 9, and similar components are identified by the same reference numerals. The thin film resistor 50 is illustrated in FIG. 11 on an insulating layer 4 similar to that of the integrated circuit 1 of FIGS. 2 to 7. The main difference between the thin film resistor 50 and the thin film resistors 5 is that the width of the resistive film 7 over its length from the first end 8 to the second end 9 is not constant. The first portion 24 of the resistive film 7 which extends from the intermediate portion 22 to the first end 8 comprises an elongated first narrow strip 51 of width w'1 which extends from the first end 8 to a first wider portion 52 also of the first portion 24, which in turn terminates in the intermediate portion 22. The first wider portion 52 is of width w1 which is similar to the width of the intermediate portion 22. Similarly, the second portion 25 of the resistive film 7 comprises a second narrow strip 53 extending from the second end 9 to a second wider portion 54 which terminates in the intermediate portion 22. The widths w'1 of the first and second narrow strips 51 and 53 are similar, and increase progressively towards the corresponding first and second wider portions 52 and 54 at 55 and 56, respectively, in order to prevent current crowding as the current passes between the first and second narrow strips 51 and 53 and the corresponding first and second wider portions 52 and 54. The lengths of the narrow strips 51 and 53 may be any desired length, and may be longer or shorter, but typically longer than the corresponding wider portions 52 and 54, and both the length and the width w'1 of the first and second narrow strips 51 and 53 will be dictated by the desired resistance value of the thin film resistor 50.

The first and second narrow strips 51 and 53 and the first and second wider portions 52 and 54, as well as the intermediate portion 22 of the resistive film 7, are formed simultaneously by a PVD or CVD process as a single one-piece resistive film 7 of constant depth t1. The low impedance element 20 is deposited by a PVD or CVD process on top of the resistive film 7 and extends between the first and second portions 24 and 25 of the resistive film 7 to define the intermediate portion 22, and is electrically coupled over its entire area with the top major surface 14 of the resistive film 7 as already described with reference to the thin film resistors 5 of FIGS. 2 to 9.

Otherwise, the thin film resistor 50 is similar to the thin film resistor 5, and trimming of the thin film resistor 50 is likewise similar, whereby coarse trimming is carried out by extending a first trimming slot into the first trimmable area 30 from the first transverse edge 28, and fine trimming is carried out by extending a second trimming slot into the second trimmable area 31 from the second transverse edge 29.

Figure 12:
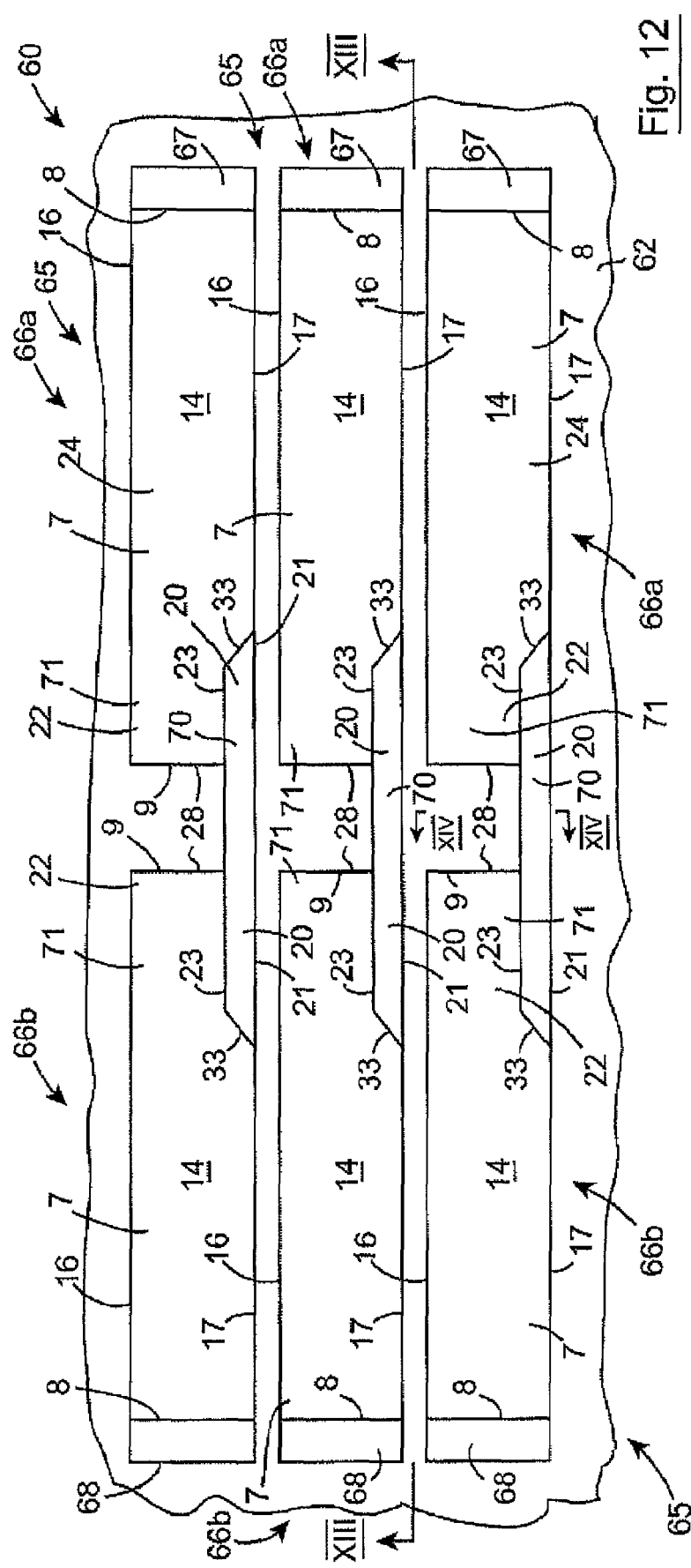
FIG. 12 is a top plan view similar to FIG. 2 of a portion of an integrated circuit according to another embodiment of the invention comprising a plurality of compound thin film resistors also according to the invention.
Figure 15:
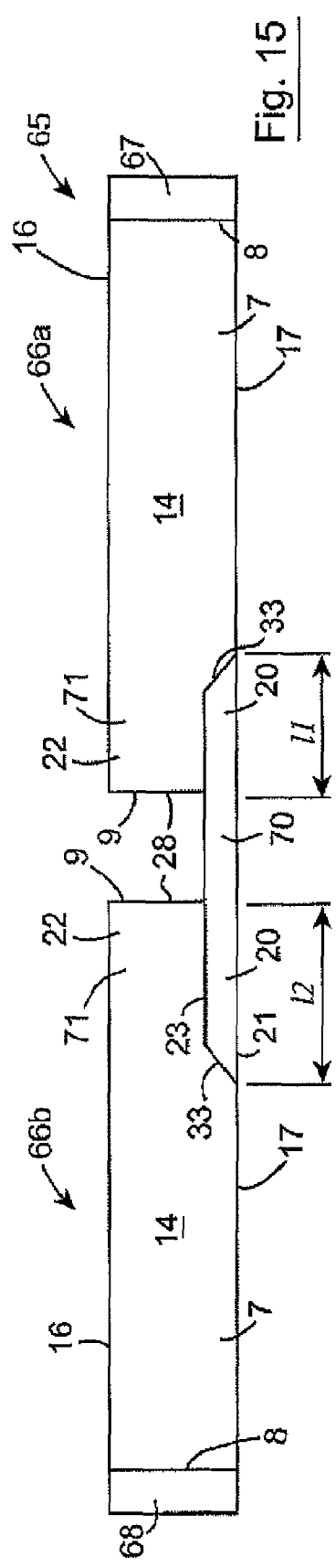
FIG. 15 is a top plan view of one of the thin film resistors of the integrated circuit of FIG. 12.

Referring now to FIGS. 12 to 15, there is illustrated a portion of an integrated circuit also according to the invention, indicated generally by the reference numeral 60. The integrated circuit 60 comprises a silicon substrate 61, a portion of which is illustrated in FIG. 13, and an electrically insulating layer 62 of silicon dioxide on top of the silicon substrate 61. A plurality of compound thin film resistors also according to the invention, indicated generally by the reference numeral 65, are formed on the insulating layer 62, three of which compound thin film resistors 65 are illustrated in FIG. 12. Each compound thin film resistor 65 is formed by a pair of thin film resistors 66a and 66b also according to the invention, which are electrically coupled in series between corresponding first and second electrical contact pads 67 and 68. The thin film resistors 66 are somewhat similar to the thin film resistors 5 of FIGS. 2 to 7, and similar components are identified by the same reference numerals. The thin film resistors 66 of each compound thin film resistor 65 are electrically coupled in series between the corresponding first and second electrical contact pads 67 and 68 by a low impedance element 70, which forms the low impedance elements 20 of the thin film resistors 66 of each compound thin film resistor 65.

The main difference between the thin film resistors 66 and the thin film resistors 5 of FIGS. 2 to 7 is that the low impedance element 20 of each thin film resistor 66, while located intermediate the first and second ends 8 and 9 of the resistive film 7, is located adjacent the second end 9 of the resistive film 7 rather than being spaced apart from the second end 9, as in the case of the thin film resistors 5. Thus, in this embodiment of the invention the second end 9 of the resistive film 7 of each thin film resistor 66 forms the first transverse edge 28 of the intermediate portion 22. The intermediate portion 22 of each thin film resistor 66, while being located intermediate the first and second ends 8 and 9 of the corresponding resistive film 7, is located adjacent the second end 9 of the resistive film 7. Accordingly, each thin film resistor 66 is provided with only one trimmable area, namely, a first trimmable area 71, which is similar to the first trimmable area 30 of the thin film resistors 5, and which is defined between the first side edge 16 of the resistive film 7, the first transverse edge 28 and the second side edge 23 of the corresponding low impedance element 20 in the corresponding intermediate portion 22.

In this case, the first end 8 of the thin film resistor 66a of each compound thin film resistor 65 is coupled to the corresponding first electrical contact pad 67, while the first end 8 of the thin film resistor 66b of each compound thin film resistor 65 is coupled to the corresponding second electrical contact pad 68.

Accordingly, since the thin film resistors 66a and 66b of each compound thin film resistor 65 each comprises a first trimmable area 71, the compound thin film resistors 65 can be subjected to coarse and fine trimming by carrying out coarse trimming in the first trimmable area 71 of the thin film resistor 66a and fine trimming in the first trimmable area 71 of the thin film resistor 66b, or vice versa. Trimming of the first trimmable areas 71 is carried out in similar fashion to that described with reference to the thin film resistor 5 of FIGS. 2 to 7. Where the first trimmable area 71 of the thin film resistor 66a is to be provided for coarse trimming, and the first trimmable area 71 of the thin film resistor 66b is to be provided for fine trimming, in general, the length l2 of the low impedance element 20 extending from the second end 9 of the thin film resistor 66b along the first trimmable area 71 thereof will be longer than the length l1 of the low impedance element 20 extending from the second end 9 of the thin film resistor 66a along the first trimmable area 71 thereof, in order to provide higher trim resolution in the thin film resistor 66b.

While the thin film resistors 66 have been described as forming compound thin film resistors 65, it will be readily apparent to those skilled in the art that each thin film resistor 66 could form a single thin film resistor in its own right, and in which case, it is envisaged that the first end of the thin film resistor 66 would be electrically coupled to a first contact pad, and the second end of the thin film resistor 66 would be coupled to a second contact pad by a portion of the low impedance element 20 extending beyond the second end of the thin film resistor 66.

Referring now to FIGS. 16 and 17, there is illustrated a thin film resistor 80 according to another embodiment of the invention. The thin film resistor 80 is substantially similar to the thin film resistor 5 of FIGS. 2 to 7, and similar components are identified by the same reference numerals. The thin film resistor 80 is illustrated in FIG. 17 on an insulating layer 4, which is similar to that the integrated circuit 1 of FIGS. 2 to 7. In this embodiment of the invention, the thin film resistor 80 is provided with two low impedance elements, namely, a first low impedance element 81 and a second low impedance element 82, both of which are located on the resistive film 7 intermediate the first and second ends 8 and 9, respectively, thereof. The first low impedance element 81 is located adjacent the first end 8 of the resistive film 7, and defines a first intermediate portion 83 of the resistive film 7, which is similar to the intermediate portion 22 of the thin film resistor 5. The second low impedance element 82 is located adjacent the second end 9 of the resistive film 7, and defines a second intermediate portion 84 of the resistive film 7, which is also similar to the intermediate portion 22 of the thin film resistor 5.

A first transverse edge forming slot 85 similar to the first transverse edge forming slot 26 extends into the first intermediate portion 83 for forming a first transverse edge 28. A second transverse edge forming slot 86 extends into the second intermediate portion 84 for forming a second transverse edge 29. The first transverse edge 28 defines with the first side edge 16 of the resistive film 7 and the second side edge 23 of the first low impedance element 81 a first trimmable area 87, while the second transverse edge 29 defines with the first side edge 16 of the resistive film 7 and the second side edge 23 of the second low impedance element 82, a second trimmable area 88. The first and second trimmable areas 87 and 88 are substantially similar to the first and second trimmable areas 30 and 31 of the thin film resistor 5, and in this embodiment of the invention, the first low impedance element 81 extends for a length l1 from the first transverse edge 28 along the first trimmable area 87, which is shorter than the length l2 that the second low impedance element 82 extends from the second transverse edge 29 along the second trimmable area 88. Accordingly, the first trimmable area 87 is suitable for coarse trimming the resistance of the thin film resistor 80, while the second trimmable area 88 is suitable for fine trimming the resistance of the thin film resistor 80.

The first and second transverse edge forming slots 85 and 86 define with the adjacent first and second ends 8 and 9, respectively, first and second focus areas 90 and 91, respectively, for facilitating focusing of the laser light trimming beam prior to forming the first and second trimming slots 34 and 35 in the first and second trimmable areas 87 and 88, respectively.

The thin film resistor 80 is electrically coupled to the first and second contact pads 10 and 11 by the first and second low impedance elements 81 and 82, respectively.

The resistive film 7 and the first and second low impedance elements 81 and 82 are of similar materials and are formed by similar processes to those of the resistive film 7 and the low impedance element 20 of the thin film resistor 5. The first and second low impedance elements 81 and 82 are deposited directly onto the resistive film 7 and are in direct electrical contact with the resistive film 7 in the area of the resistive film 7 overlaid by the respective first and second low impedance elements 81 and 82.

Otherwise, the thin film resistor 80 is similar to the thin film resistor 5, and trimming of the resistance of the thin film resistor 80 is carried out in similar fashion to that described with reference to FIGS. 2 to 9. Coarse trimming of the thin film resistor 80 is carried out by progressively extending the first trimming slot 34 from the first transverse edge 28 into the first trimmable area 87 until the resistance value of the thin film resistor 80 is just below the desired value, and then fine trimming is carried out by progressively extending the second trimming slot 35 from the second transverse edge 29 into the second trimmable area 88 until the resistance of the thin film resistor 80 is at the desired value.

Referring now to FIG. 18, there is illustrated a thin film resistor 95 according to another embodiment of the invention. The thin film resistor 95 is substantially similar to the thin film resistor 5 described with reference to FIGS. 2 to 7, and similar components are identified by the same reference numerals. The only difference between the thin film resistor 95 and the thin film resistor 5 is in the intermediate portion 22. In this embodiment of the invention, the first and second transverse edge forming slots 26 and 27 in the intermediate portion 22 which form the transverse edges 28 and 29 have been omitted. Accordingly, the low impedance element 20 defines with the first side edge 16 of the resistive film 7 a single trimmable area 96 in the intermediate portion 22.

Trimming of the thin film resistor 95 is carried out by initially focusing the laser light trimming beam in the trimmable area 96 at a position intermediate the ends 33 of the low impedance element 20. In order to facilitate coarse and fine trimming of the thin film resistor 95, the focusing of the laser light trimming beam should be carried out at a position offset from the midpoint of the low impedance element 20 between the ends 33 thereof. For example, at a position represented by the chain line 97, which is closer to the end 33*a* of the low impedance element 20 than to the end 33*b* of the low impedance element 20. Coarse trimming is then carried out by advancing the first trimming slot 34 from the chain line 97 in the direction of the arrow D in the trimmable area 96 towards the end 33*a*, until the resistance of the thin film resistor 95 is just below the desired resistance value. Fine trimming of the thin film resistor 95 is carried out by advancing the second trimming slot 35 from the chain line 97 in the direction of the arrow E in the trimmable area 96 towards the end 33*b* until the resistance value of the thin film resistor 95 is at the desired value.

Otherwise, the thin film resistor 95 and its trimming is similar to that of the thin film resistor 5 described with reference to FIGS. 2 to 9.

While the low impedance elements of the thin film resistors described with reference to FIGS. 2 to 9, FIGS. 10 and 11, FIGS. 12 to 15, FIGS. 16 and 17, and FIG. 18 have been described as overlaying the corresponding resistive film or films, in certain cases, it is envisaged that the low impedance elements may be located to one side of the resistive film or films and adjacent thereto, although an advantage of overlaying the low impedance elements on the resistive film or films is that the die area required for the thin film resistors is minimised. Additionally, where the low impedance elements are of a material which is more tolerant of the cutting effect of the laser light trimming beam than the material of the resistive film, a further reduction in die area can be achieved, since the thin film resistors can be located more closely to each other.

While the thin film resistors described with reference to FIGS. 2 to 9, FIGS. 10 and 11, and FIGS. 16 and 17 have been described as having the first and second transverse edges being formed by respective first and second transverse edge forming slots extending from the first side edge into the resistive film, in certain cases, it is envisaged that the entire area of the resistive film bounded by the first and second transverse edge forming slots and the low impedance element may be removed by etching or otherwise. However, an advantage of forming the first and second transverse edges by the first and second transverse edge forming slots is that a more accurate and true transverse edge is obtained when the first and second transverse edges are formed by corresponding first and second transverse edge forming slots, rather than by completely removing the portion of the resistive film bounded by the first and second transverse edge forming slots and the low impedance element.

While the thin film resistors according to the invention have been described as being formed on integrated circuits of particular materials, the thin film resistors may be formed on any integrated circuit, or indeed any other suitable substrate. Needless to say, while particular ranges of widths and thicknesses and types of materials of the resistive films and the low impedance elements have been described, any other suitable widths, thicknesses and materials may be selected in the formation of the resistive films and the low impedance elements.

Additionally, while the film resistors according to the invention have been described as being thin film resistors, the film resistors may be thick film resistors, which may be formed on integrated circuits, or indeed may be of the type formed on printed circuit boards, or on other substrates.

While the ends of the low impedance elements have been described as being chamfered for avoiding current crowding adjacent the ends of the low impedance elements, while this is desirable, it is not essential, and furthermore, the ends of the low impedance elements may be otherwise shaped for avoiding current crowding, for example, they may be rounded by radiusing, or the like.

Needless to say, coarse trimming of each thin film resistor described with reference to FIGS. 2 to 9, FIGS. 10 and 11, and FIGS. 16 and 17 could be carried out in the second trimmable area and fine trimming could be carried out in the first trimmable area.

While the low impedance elements have been described as being located on the resistive films with the first side edge of each low impedance element coinciding with the second side edge of the corresponding resistive film, while this is preferable, it is not essential. For example, the low impedance elements may be located or the resistive films with the first side edge of each low impedance element spaced apart from the second side edge of the corresponding resistive film. However, by locating the low impedance elements with the first side edge of each low impedance element coinciding with the second side edge of the corresponding resistive film, the width of the trimmable area or areas defined between the first side edge of the resistive film and the second side edge of the low impedance element is maximised, thereby minimising the width of the resistive films required at the intermediate portion or portions thereof. However, it is envisaged in certain cases that the low impedance element of each thin film resistor may be located intermediate the first and second side edges of the corresponding resistive film. In which case, trimmable areas may be provided on the respective opposite sides of the low impedance element between the low impedance element and the first side edge of the corresponding resistive film, and the low impedance element and the second side edge of the corresponding resistive film.

While the low impedance element of the thin film resistors described with reference to FIGS. 2 to 7 and FIGS. 10 and 11 have been described with the portion of the low impedance element extending along the first trimmable area being of length less than the length of the portion of the low impedance element extending along the second trimmable area, in certain cases, it is envisaged that the length of the portion of the low impedance element extending along the first trimmable area may be of similar length to the length of the portion of the low impedance element extending along the second trimmable area. In which case, the trim resolution which would be achievable in each of the first and second trimmable areas would be substantially similar. However, by raising the resistance of the thin film resistor to a level just below the desired resistance during coarse trimming in the first trimmable area, a relatively short second trimming slot in the second trimmable area should be sufficient in order to raise the resistance of the thin film resistor to the desired level, and thus fine trimming in the second trimmable area would be carried out in an area adjacent the second transverse edge with relatively high resolution. Similarly, in the thin film resistors described with reference to FIGS. 12 to 15 and FIGS. 16 and 17, the length of the respective low impedance elements could be substantially similar.

The invention claimed is:

1. A film resistor comprising:
a resistive film of electrically resistive material extending longitudinally between a first end and a spaced apart second end, and having opposite spaced apart first and second major surfaces extending between opposite spaced apart first and second side edges, the resistive film being adapted to accommodate current flow between the first and second ends, and
a low impedance element electrically coupled to the resistive film adjacent an intermediate portion of the resistive film disposed intermediate the first and second ends for conducting current in parallel with the intermediate portion of the resistive film for reducing current density of current flow in the intermediate portion for facilitating trimming of the resistance of the film resistor in the intermediate portion thereof.

2. A film resistor as claimed in claim 1 in which the low impedance element is electrically coupled to the resistive film along the length of the intermediate portion in a direction between the first and second ends of the resistive film.

3. A film resistor as claimed in claim 1 in which the low impedance element abuts and is electrically coupled to the first major surface of the resistive film along the intermediate portion.

4. A film resistor as claimed in claim 1 in which the low impedance element is laminated with the resistive film adjacent the intermediate portion.

5. A film resistor as claimed in claim 1 in which the low impedance element overlays the first major surface of the resistive film adjacent the intermediate portion, and is electrically coupled to the resistive film throughout the area thereof overlaid by the low impedance element.

6. A film resistor as claimed in claim 1 in which the low impedance element is electrically coupled to the resistive film adjacent the second side edge thereof.

7. A film resistor as claimed in claim 1 in which the low impedance element is electrically coupled to the resistive film at a location spaced apart from the first side edge thereof and defines a trimmable portion in the intermediate portion between the low impedance element and the first side edge.

8. A film resistor as claimed in claim 7 in which the resistance of the film resistor is trimmable by progressively extending a trimming slot in the trimmable portion.

9. A film resistor as claimed in claim 7 in which a first transverse edge extends in the intermediate portion in a general direction from the first side edge of the resistive film to the low impedance element, the first transverse edge defining with the first side edge and the low impedance element a first trimmable area in the trimmable portion.

10. A film resistor as claimed in claim 9 in which the resistance of the film resistor is trimmable by progressively extending a first trimming slot in the first trimmable area.

11. A film resistor as claimed in claim 10 in which the first trimming slot is extended into the first trimmable area from the first transverse edge.

12. A film resistor as claimed in claim 10 in which a second transverse edge spaced apart from the first transverse edge extends in the intermediate portion in a general direction from the first side edge of the resistive film to the low impedance element, the second transverse edge defining with the first side edge and the low impedance element a second trimmable area in the trimmable portion.

13. A film resistor as claimed in claim 12 in which the second transverse edge is disposed between the first transverse edge and the second end of the resistive film.

14. A film resistor as claimed in claim 12 in which the resistance of the film resistor is trimmable by progressively extending a second trimming slot in the second trimmable area.

15. A film resistor as claimed in claim 14 in which the second trimmable slot is extended into the second trimmable area from the second transverse edge.

16. A film resistor as claimed in claim 14 in which one of the first and second trimming slots is extended into the corresponding one of the first and second trimmable areas for coarse trimming the resistance of the film resistor, and the other one of the first and second trimming slots is extended into the corresponding one of the first and second trimmable areas for fine trimming of the resistance of the film resistor.

17. A film resistor as claimed in claim 12 in which the current density progressively reduces in the respective first and second trimmable areas towards the first side edge of the resistive film and the corresponding one of the first and second transverse edges.

18. A film resistor as claimed in claim 1 in which the resistive film is an elongated resistive film extending longitudinally between the first and second ends thereof.

19. A film resistor as claimed in claim 1 in which the low impedance element is an elongated low impedance element extending longitudinally in a general direction parallel to the resistive film.

20. A film resistor as claimed in claim 1 in which respective opposite ends of the low impedance element are shaped to minimise current crowding adjacent the ends thereof.

21. A film resistor as claimed in claim 20 in which the respective ends of the low impedance element are chamfered such that a side edge of the low impedance element disposed adjacent the second side edge of the resistive film is longer than an opposite side edge thereof disposed remote of the second side edge of the resistive film.

22. A film resistor as claimed in claim 1 in which the low impedance element is more tolerant of the cutting effect of a laser light trimming beam than the resistive film.

23. A film resistor as claimed in claim 1 in which the low impedance element is of electrical resistance which is lower than the electrical resistance of the resistive film.

24. A film resistor as claimed in claim 1 in which the resistive film is a thin film resistor.

25. A film resistor as claimed in claim 1 in which a pair of low impedance elements are electrically coupled to the resistive film adjacent corresponding spaced apart intermediate portions of the resistive film.

26. A film resistor as claimed in claim 25 in which one of the low impedance elements and the corresponding intermediate portion is located adjacent one of the first and second ends of the resistive film, and the other one of the low impedance elements and the corresponding one of the intermediate portions is located adjacent the other one of the first and second ends of the resistive film.

27. A compound film resistor comprising a pair of film resistors as claimed in claim 1 electrically coupled in series by the low impedance elements of the respective film resistors.

28. An integrated circuit comprising an electrically insulating substrate layer and a film resistor as claimed in claim 1 formed on the substrate layer.

29. An integrated circuit comprising an electrically insulating substrate layer, and a plurality of spaced apart film resistors as claimed in claim 1 formed on the substrate layer with the second major surfaces of the resistive films abutting the substrate layer, and the resistive films extending parallel to each other with the first side edge of each resistive film lying adjacent but spaced apart from the second side edge of the adjacent resistive film.

* * * * *